United States Patent [19]
Rando

[11] Patent Number: 5,500,524
[45] Date of Patent: Mar. 19, 1996

[54] DIODE LASER CO-LINEAR LIGHT BEAM GENERATOR

[75] Inventor: Joseph F. Rando, Los Altos Hills, Calif.

[73] Assignee: LeveLite Technology, Inc., Mountain View, Calif.

[21] Appl. No.: 311,671

[22] Filed: Sep. 23, 1994

[51] Int. Cl.$^6$ ..................................... G01B 11/26
[52] U.S. Cl. ........................ 250/216; 250/559.3; 356/153; 356/138; 33/286
[58] Field of Search .................................. 250/216, 561, 250/562, 559.3, 559.29; 356/138, 139.1, 152.2, 148, 149, 375, 248, 250, 153; 33/281, 282, 285, 286; 359/626, 627, 628, 636

[56] References Cited

U.S. PATENT DOCUMENTS 4,252,439  2/1987  Drozella .................................. 356/138
5,144,487  9/1992  Hersey .................................... 359/629

Primary Examiner—Edward P. Westin
Assistant Examiner—John R. Lee
Attorney, Agent, or Firm—Thomas M. Freiburger

[57] ABSTRACT

The present invention relates to the efficient and cost-effective generation of two co-linear laser beams for the purpose of alignment, particularly in the construction industry. The unequal divergence of the light from a typical laser diode produces a beam of elliptical cross section. Two roughly equal co-linear beams of light can be generated by reflecting the collimated elliptical beam from two mirror surfaces at 90° to each other or a single element dividing the elliptical beam in two. Techniques are described for generating offset parallel beams, and for correcting for inherent knife-edge diffraction effects due to division of the beam.

22 Claims, 1 Drawing Sheet

U.S. Patent   Mar. 19, 1996   5,500,524
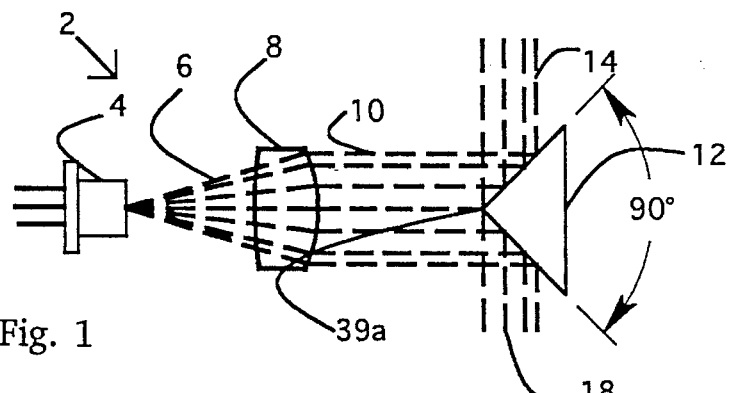
Fig. 1
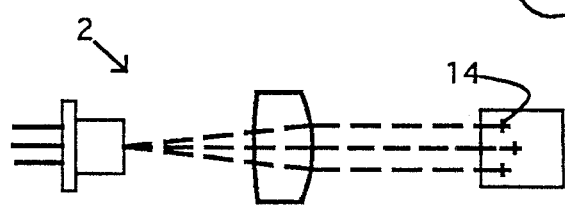
Fig. 2
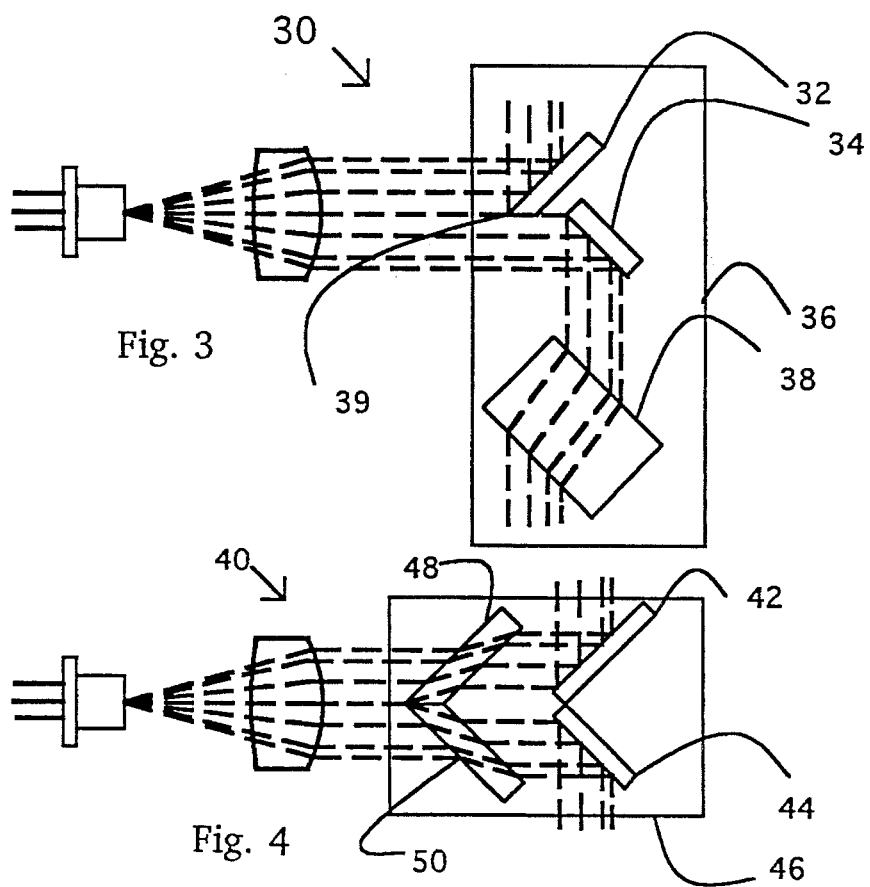
Fig. 3
Fig. 4

DIODE LASER CO-LINEAR LIGHT BEAM GENERATOR

REFERENCE TO DISCLOSURE DOCUMENT

The subject matter of this invention was described in part in Disclosure Document No. 359086, filed Aug. 4, 1994.

BACKGROUND OF THE INVENTION

This invention is concerned with laser diodes, and more specifically with the efficient generation of two opposed and substantially co-linear beams from a single laser diode.

Compact battery-operated laser projectors are used in the construction industry for alignment purposes. The visible beam of light projects a straight line in space which can be used to locate building references. A leveled or plumb beam of light can be used to set the level or plumb directions of building elements such as floors, walls and columns. In many applications a small-diameter visible laser beam replaces a string line. The beam strikes an object producing a small spot of light. The center of the spot may be marked with a pencil as needed. Two co-linear beams are often desired to produce two spots of light which are the end points of a straight line. In a typical application replacing a plumb bob, a spot of light on the floor is located directly below a spot on the ceiling. For example, in U.S. Pat. No. 5,144,487 two co-linear beams are generated using a beam splitter and a mirror. In this case the optical elements must be precisely aligned to produce the required co-linear beams. Other methods of using a beam splitter and subsequent mirrors and glass plates are straightforward but cumbersome. The present invention offers a more compact design which has lower manufacturing cost.

SUMMARY OF THE INVENTION

Generally, visible laser diodes have a much wider divergence in the direction perpendicular to the junction than that parallel to the junction. Typical values are 35° in one axis and 10° in the other. Normally, the center portion of the beam is apertured to produce a beam which is nearly round. If other beams are required, a beam splitter and subsequent optic are used to manipulate the newly created beam. The invention uses the elliptical shape of the collimated beam to generate two beams of light by splitting the energy spatially instead of by partial reflection. To achieve the co-linear beams, the included angle between the two mirror surfaces must be substantially 90°. At the same time, rays within the incoming beam must be substantially parallel. In addition, to avoid any offset of the two co-linear beams at the mirrors, the vertex of the mirrors must be at the center of the incoming beam.

A benefit of the invention is the ease of manufacture of the precise 90° mirror element. Such an element can be economically manufactured by several low-cost methods. It can be ground as a glass porro prism or injection molded in plastic. A subsequent reflective coating is then required. It can also be replicated using conventional techniques or formed by gluing two mirrors to a substrate while holding them precisely at 90° to each other. Optical replication is a well-known optical manufacturing process in which a master optic is first coated with a soft release layer and then a hard optically reflecting layer. An aluminum or glass surface is then cemented to the master with epoxy. Finally, the aluminum or glass replica is created by pulling the parts apart at the release layer. This process can be used to form the 90° mirrors.

Machining the 90° mirror with a diamond tool (or other very hard machining tool) from an aluminum (or other metal) substrate is an attractive method of manufacture because the 90° angle and reflective surface can be obtained in one operation, with a single machine setup.

When the co-linear beam generator is placed on a self-leveling platform, a co-linear plumb beam directed up and down can be produced simultaneously. Likewise, when such a co-linear beam generator is placed in a horizontal orientation, two level co-linear beams are produced. In some applications it may be necessary to project more power in one beam than in the other. This can be accomplished by placing the vertex of the mirrors closer to one edge of the beam. The resulting offset of the beam can be compensated for by using a glass plate which shifts the beam according to the glass thickness and index.

Knife edge diffraction at each mirror produces a small deviation of the beam, this effect being known in the art. The deviation is readily corrected by a slight adjustment of the 90° angle (depending on the beam's wavelength and diameter). A slight adjustment of focus can also be used to produce the slight correction required as a result of diffraction, by adjusting the distance between the laser diode and the collimating lens.

DESCRIPTION OF THE DRAWINGS

The accompanying drawings, which are incorporated in and constitute part of the specification, schematically illustrate a preferred embodiment of the invention and, together with the general description given above and the detailed description of the preferred embodiment given below, serve to explain the principles of the invention.

FIG. 1 schematically illustrates the general view of the invention viewed in the horizontal direction with the beams directed vertically up and down.

FIG. 2 shows the optical arrangement of FIG. 1 as viewed from above.

FIG. 3 is an alternate embodiment of the invention in which the mirrors are separate and offset, with the offset being corrected using a glass plate.

FIG. 4 is an alternate embodiment of the invention in which the offset is avoided by using two glass plates ahead of the reflecting surfaces.

DESCRIPTION OF PREFERRED EMBODIMENTS

Referring now to the drawings, wherein like components are given like reference numerals, a preferred embodiment 2 is shown in FIG. 1. A laser diode 4 produces a diverging beam of light 6 which is collimated by a lens 8 into a parallel beam of light 10. The beam 10 strikes a 90° reflector 12 producing an upwardly directed beam 14 and a downwardly directed beam 18. Because the incoming beam is parallel and the included angle between the mirror surfaces is 90°, the reflected beams will be substantially parallel to each other. Note that precise 45° orientation of the reflector faces with the oncoming beam is not critical. Co-linearity of the resulting beams can be achieved by the placement of the 90° corner or vertex 19 in the beam 10, equally dividing the beam.

The elliptical shape of the diode beam, with different divergence rates on the two perpendicular axes, enables two roughly equal parallel beams to be created by the reflection.

The 90° reflector can be made by coating a glass porro prism or a plastic injection molded porro prism. It can also be made by replication or gluing mirror segments to each other or a substrate. The mounting platform for these three optical elements is not shown and must hold the lens and diode in alignment during the life of the instrument. The drive electronics for the laser diode are also not shown and are well understood.

FIG. 2 shows the same elements of FIG. 1 viewed from above. The upwardly directed beam 14 is viewed on end. Note the difference in divergence of the beam from the laser diode, on two different perpendicular axes, as seen in side and top views. FIG. 1 shows a long dimension of the beam, while FIG. 2 shows its short dimension.

FIG. 3 shows another preferred embodiment 30 in which a mirror 32 and a mirror 34 provide the reflection. The edge of mirror 32 is bevelled to allow the mirrors to be closer together to avoid power loss in the beam. The included angle between the reflecting surfaces is substantially 90°. These mirrors are fastened to a substrate 36. A substantially parallel glass plate 38 (i.e. having two essentially parallel surfaces) is required to correct for the offset caused by the offset mirror locations. The plate can also be fastened to the substrate 36. The offset can be adjusted by tilting the plate relative to the beam, and such an adjustment may be useful in manufacturing. All or some of the elements may be glued to a substrate 36 for ease of manufacture. As discussed above, greater beam power can be generated in one of the emerging oppositely-directed beams than the other by positioning the vertex 39 (19 in FIG. 1) of the two reflective surfaces such that the long dimension of the beam is divided unequally. This will create a slight offset of the two beams, but the offset is easily corrected with the apparatus of FIG. 3, whether or not the reflecting surfaces are offset as in FIG. 3.

FIG. 4 shows another preferred embodiment 40 in which mirrors 42 and 44 provide the reflection. The included angle between the two reflecting surfaces is substantially 90°. The mirrors are fastened to a substrate 46. Bevelled substantially parallel glass plates 48 and 50 are provided to avoid beam offset and loss from the beam. Again, for specific applications beam power can be divided unequally between the two emerging co-linear beams. Resulting offset can be corrected using the parallel-surfaced glass plates 48, 50 by rotating them or manipulating each individually, prior to adhering or otherwise fastening these glass plates to the substrate 46.

Many modifications to the preferred embodiment will be apparent to those of ordinary skill in the art but which will still embody the invention. Therefore, the invention is not intended to be limited by the scope of the detailed description of the drawings, but by the claims which follow.

I claim:

1. An alignment system of two essentially co-linear light beams comprising:

a diode laser source providing a beam which diverges at two substantially different rates on two perpendicular beam axes, lens means for converting the diverging beam into a substantially collimated beam of substantially different dimensions on the two axes, a greater dimension on a long axis and a smaller dimension on a short axis, two reflective surfaces positioned in the path of the substantially collimated beam and at substantially 90° to each other and oriented to produce two parallel beams of light projected in opposite directions from the single beam, by dividing the single beam through the long axis.

2. An alignment system as in claim 1, wherein centers of the two parallel beams are co-linear.

3. An alignment system as in claim 2, wherein the two reflecting surfaces are formed on a single component.

4. An alignment system as in claim 3, wherein the reflecting surfaces comprise a plastic injection molded part with coated surfaces.

5. An alignment system as in claim 3, wherein the reflecting surfaces are created by optical replication.

6. An alignment system as in claim 2, wherein the two reflecting surfaces comprise mirror surfaces mechanically retained in position.

7. An alignment system as in claim 6, wherein the two reflecting surfaces are glued in place on a substrate.

8. An alignment system as in claim 6, wherein the two reflecting surfaces are formed on components which are glued to each other.

9. An alignment system as in claim 1, wherein the two reflective surfaces are positioned such that the two parallel beams of light are produced in offset relationship, and including at least one glass plate having substantially parallel surfaces positioned in the path of at least one of the parallel beams so as to correct the beam offset.

10. An alignment system as in claim 1, wherein the two reflective surfaces have a vertex line defined at their intersection, the vertex line being off-center along the long axis of the collimated beam so as to produce greater power in one of the two parallel beams than the other.

11. An alignment system as in claim 10, further including at least one glass plate having substantially parallel surfaces positioned in the path of at least one of the parallel beams so as to correct for an offset between the two parallel beams created by the position of the vertex.

12. An alignment system as in claim 1, further including means for correcting for angular deviation of the two parallel beams due to inherent knife edge diffraction.

13. An alignment system as in claim 12, wherein the means for correcting for angular deviation comprises an adjustment of the angular relationship of the two reflected surfaces, to deviate slightly from 90°.

14. An alignment system as in claim 12, wherein the means for correcting for angular deviation comprises said lens means being positioned relative to the laser diode source so as to produce a slightly converging beam as said substantially collimated beam.

15. A method for producing two essentially co-linear light beams from a single laser diode source, comprising:

providing a laser diode source to produce a beam which diverges at two substantially different rates on two perpendicular beam axes, collimating the laser diode beam to produce a substantially collimated beam of substantially different dimensions on the two axes, the collimated beam having a greater dimension on a long axis and a smaller dimension on a short axis, positioning in the path of the substantially collimated beam two reflective surfaces at substantially 90° to each other, and orienting the two reflective surfaces to divide the substantially collimated beam through its greater dimension to reflect the beam and produce two parallel beams of light directed in opposite directions from the single beam.

16. The method of claim 15, including producing the two reflective surfaces by machining a metal component to a mirror-like finish at the desired angle in a single machine setup.

17. The method of claim 15, further including orienting the two parallel beams in the vertical direction and using beam spots produced where each of the parallel beams strike surfaces, in order to locate two points which are plumb relative to one another.

18. The method of claim 15, including locating a vertex of the two reflective surfaces off-center along the greater dimension of the collimated beam, so as to produce greater power in one of the two parallel beams than the other.

19. The method of claim 18, further including correcting for a slight offset between the two parallel beams, caused by the location of the vertex, by positioning a glass plate having two substantially parallel surfaces obliquely in the path of one of the parallel beams.

20. The method of claim 15, further including correcting for angular deviation of the two parallel beams due to inherent knife edge diffraction.

21. The method of claim 20, wherein the step of correcting for angular deviation of the two parallel beams comprises adjusting the angular relationship of the two reflective surfaces to deviate slightly from 90°.

22. The method of claim 20, wherein the step of correcting for angular deviation of the two parallel beams comprises, in said collimating step, producing a beam which is slightly converging as said substantially collimated beam.

* * * * *